(12) United States Patent
Lee et al.

(10) Patent No.: US 7,935,952 B2
(45) Date of Patent: May 3, 2011

(54) NON-VOLATILE MEMORY DEVICE HAVING THRESHOLD SWITCHING RESISTOR, MEMORY ARRAY INCLUDING THE NON-VOLATILE MEMORY DEVICE AND METHODS OF MANUFACTURING THE SAME

(75) Inventors: Myoung-jae Lee, Yongin-si (KR); Young-soo Park, Yongin-si (KR); Chang-bum Lee, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 658 days.

(21) Appl. No.: 12/073,510

(22) Filed: Mar. 6, 2008

(65) Prior Publication Data
US 2009/0086527 A1    Apr. 2, 2009

(30) Foreign Application Priority Data
Mar. 23, 2007    (KR) .......... 10-2007-0028861

(51) Int. Cl.
*H01L 47/00*    (2006.01)

(52) U.S. Cl. .............. 257/4; 257/5; 438/381
(58) Field of Classification Search .......... 257/4, 5; 438/381
See application file for complete search history.

(56) References Cited

U.S. PATENT DOCUMENTS

| | | | |
|---|---|---|---|
| 7,259,387 B2* | 8/2007 | Kawazoe et al. | 257/2 |
| 7,303,971 B2* | 12/2007 | Hsu et al. | 438/381 |
| 7,345,907 B2* | 3/2008 | Scheuerlein | 365/148 |
| 7,426,128 B2* | 9/2008 | Scheuerlein | 365/63 |
| 7,433,222 B2* | 10/2008 | Hosoi et al. | 365/148 |
| 7,743,488 B2* | 6/2010 | Tamai et al. | 29/610.1 |
| 2009/0039335 A1* | 2/2009 | Terao et al. | 257/4 |

* cited by examiner

*Primary Examiner* — Douglas M Menz
(74) *Attorney, Agent, or Firm* — Harness, Dickey & Pierce, P.L.C.

(57) ABSTRACT

Provided are a non-volatile memory device having a threshold switching resistor, a memory array including the non-volatile memory device, and methods of manufacturing the same. A non-volatile memory device having a threshold switching resistor may include a first resistor having threshold switching characteristics, an intermediate electrode on the first resistor, and a second resistor having at least two resistance characteristics on the intermediate electrode.

29 Claims, 5 Drawing Sheets

NON-VOLATILE MEMORY DEVICE HAVING THRESHOLD SWITCHING RESISTOR, MEMORY ARRAY INCLUDING THE NON-VOLATILE MEMORY DEVICE AND METHODS OF MANUFACTURING THE SAME

PRIORITY STATEMENT

This application claims priority under 35 U.S.C. §119 to Korean Patent Application No. 10-2007-0028861, filed on Mar. 23, 2007, in the Korean Intellectual Property Office (KIPO), the entire contents of which are incorporated herein by reference.

BACKGROUND

1. Field

Example embodiments relate to a non-volatile memory device having a threshold switching resistor, a memory array including the non-volatile memory device, and methods of manufacturing the same.

2. Description of the Related Art

A semiconductor memory array may include a plurality of unit memory cells that are connected to each other using circuits. In a dynamic random access memory (DRAM) that is an example of a semiconductor memory device, a unit memory cell may include a switch and a capacitor. The DRAM may be highly integrated and may operate at an increased speed. However, when the power is turned off, the data stored in the DRAM may be lost.

In order to solve this problem, non-volatile memory devices, which may preserve the stored data after the power is turned off (for example, flash memories), have been developed. Because flash memory is non-volatile, flash memory has a relatively low degree of integration and operates slower than a DRAM. In the field of non-volatile memory devices, research is being performed in the fields of Magnetic Random Access Memory (MRAM), Ferroelectric Random Access Memory (FRAM), Phase-change Random Access Memory (PRAM), and Resistance Random Access Memory (RRAM).

MRAM stores data using a characteristic of varying magnetization direction at a tunnel junction. FRAM stores data using a polarity property of ferroelectrics. PRAM stores data using a change in resistance value in accordance with the phase change of a specific material, and may include a resistor and a switching device. RRAM mainly uses a characteristic of a transition metal oxide, for example, a characteristic of varying resistance with respect to an applied voltage, and may include a resistor and a switching device.

A transistor or diode may be used as the switching device for such non-volatile memory devices. The transistor may include a source and drain doped with a conductive impurity and a gate laminate structure formed on a channel region between the source and drain. A diode having a switching function may be used instead of the transistor. The diode may have a p-n junction structure.

In order to improve a degree of integration, the size of the transistor and diode may be reduced. Reduction in the size of the transistor may results in reduction in current flow between the source and drain, and thus switching may not be easily carried out. As a result, data may not be recorded or deleted.

SUMMARY

Example embodiments provide a non-volatile memory device having a threshold switching resistor with a simpler structure. Example embodiments also provide a memory array including the non-volatile memory device. Example embodiments also provide methods of manufacturing the memory device and the memory array.

According to example embodiments, a non-volatile memory device may include a first resistor having threshold switching characteristics, an intermediate electrode on the first resistor, and a second resistor having at least two resistance characteristics on the intermediate electrode.

The non-volatile memory device may further include a first electrode, wherein the first resistor is formed on the first electrode, and a second electrode, wherein the second electrode is formed on the second resistor. The first resistor may include NiO or may be formed of NiO including a monovalent metal ion selected from the group consisting of an Li ion, a Na ion, a K ion, an Rb ion and a Cs ion. The amount of the monovalent metal ion in the first resistor may be in the range of about 0.001 wt % to about 10 wt %. The second resistor may be formed of at least one material selected from the group consisting of Ni oxide, Ti oxide, Hf oxide, Zr oxide, Zn oxide, Co oxide, Nb oxide, Hf oxide, W oxide, V oxide, Al oxide, Fe oxide, Cu oxide and Ta oxide, Cr oxide, TiNiO, LiNiO, AlO, InZnO, SrZrO and SrTiO. The second resistor may further include a metal ion selected from the group consisting of a Ni ion, a Ti ion, a Hf ion, a Zr ion, a Zn ion, a W ion, a Co ion and a Nb ion.

According to example embodiments, a non-volatile memory device array may include at least two first conductive lines aligned in parallel and spaced a distance apart, at least two second conductive lines aligned in a direction crossing the first conductive lines, and a laminate structure including the nonvolatile memory device of example embodiments, which is formed at intersections between the first conductive lines and the second conductive lines to form a memory cell.

According to example embodiments, a method of manufacturing a non-volatile memory device may include forming a first resistor having threshold switching characteristics on a first electrode, forming an intermediate electrode on the first resistor, and forming a second resistor having at least two resistance characteristics on the intermediate electrode.

The method may further include forming a second electrode on the second resistor. The first resistor may be formed of NiO or of NiO including a monovalent metal ion selected from the group consisting of an Li ion, a Na ion, a K ion, an Rb ion and a Cs ion. The second resistor may be formed of at least one material selected from the group consisting of Ni oxide, Ti oxide, Hf oxide, Zr oxide, Zn oxide, Co oxide, Nb oxide, Hf oxide, W oxide, V oxide, Al oxide, Fe oxide, Cu oxide and Ta oxide, Cr oxide, TiNiO, LiNiO, AlO, InZnO, SrZrO and SrTiO. The second resistor may further include a metal ion selected from the group consisting of a Ni ion, a Ti ion, a Hf ion, a Zr ion, a Zn ion, a W ion, a Co ion and a Nb ion.

According to example embodiments, a method of manufacturing a non-volatile memory device array may include forming at least two first conductive lines aligned in parallel and spaced a distance apart, forming a first resistor layer, an intermediate electrode layer and a second resistor layer on the first conductive lines, forming a laminate structure including the nonvolatile memory device manufactured according to example embodiments by patterning the first resistor layer, the intermediate electrode layer and the second resistor layer, and forming at least two second conductive lines aligned in a direction crossing the first conductive lines on the laminate structure.

The first resistor layer may be formed by sputtering, chemical vapor deposition, plasma vapor deposition and/or atomic layer deposition. The first resistor may be formed using sputtering at a temperature in the range of about 300° C. to about 400° C. in an oxygen partial pressure in the range of about 30% to about 50%. The first resistor layer may be formed by sputtering at a temperature in the range of room temperature to about 200° C. in an oxygen partial pressure in the range of about 5% to about 50%.

BRIEF DESCRIPTION OF THE DRAWINGS

Example embodiments will be more clearly understood from the following detailed description taken in conjunction with the accompanying drawings. FIGS. 1-4I represent non-limiting, example embodiments as described herein.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Hereinafter, example embodiments will now be described more fully with reference to the accompanying drawings, in which example embodiments are shown. Example embodiments may, however, be embodied in many different forms and should not be construed as being limited to the embodiments set forth herein. Rather, these embodiments are provided so that this disclosure will be thorough and complete, and will fully convey the scope of example embodiments to one skilled in the art. In the drawings, the thicknesses of layers and regions are exaggerated for clarity. Like numbers refer to like elements.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
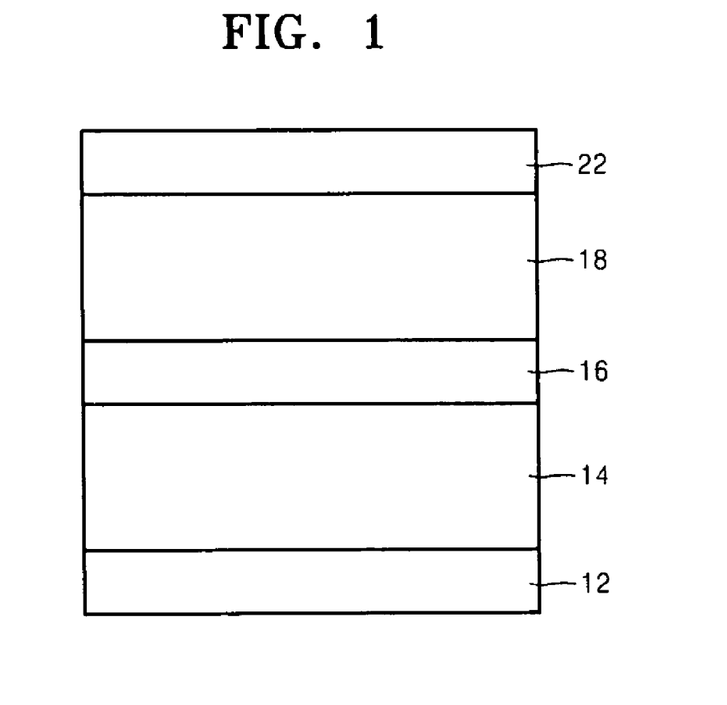
FIG. 1 shows a cross-sectional view of a non-volatile memory device according to example embodiments.

FIG. 1 shows a cross-sectional view of a non-volatile memory device according to example embodiments. Referring to FIG. 1, a non-volatile memory device may include a first electrode 12, a first resistor 14 having threshold switching characteristics formed on the first electrode 12, an intermediate electrode 16 formed on the first resistor 14, a second resistor 18 having at least two resistance characteristics formed on the intermediate electrode 16, and a second electrode 22 formed on the second resistor 18. The first resistor 14 may function as a transistor or diode, and the second resistor 18 may function as a data storage unit which stores data. The intermediate electrode 16 may function as a common electrode between the first resistor 14 and the second resistor 18. The positions of the first resistor 14 and the second resistor 18 may be interchangeable.

The first resistor 14 may be formed of Ni oxide, V oxide or GST ($Ge_2Sb_2Te_5$). The first resistor 14 may have threshold switching characteristics in which the resistance thereof is different at voltages above and below a threshold voltage according to formation conditions, e.g., oxygen partial pressure and temperature applied during the formation of the first resistor 14. The first resistor 14 may be formed by adding inert and oxygen gases using sputtering, chemical vapor deposition, plasma vapor deposition and/or atomic layer deposition. When the first resistor 14 is formed of Ni oxide having threshold switching characteristics, the first resistor 14 may be formed by adding Ar and oxygen gases by sputtering using a Ni target at a temperature in the range of about 300° C. to about 400° C. The oxygen partial pressure may be in the range of about 30% to about 50%.

Alternatively, the first resister 14 may be formed by adding a monovalent metal ion to Ni oxide. The monovalent metal ion may be selected from the group consisting of a Li ion, a Na ion, a K ion, a Rb ion and a Cs ion, and the amount of the monovalent metal ion may be in the range of about 0.001 wt % to about 10 wt %. The monovalent metal ion in the first resistor 14 may be substituted at the Ni site of Ni oxide and may increase the concentration of holes in Ni oxide. Accordingly, although formed at room temperature (at about 25° C.), the first resistor 14 including a monovalent metal ion may have threshold switching characteristics.

The first resistor 14 formed of Ni oxide including a monovalent metal ion may be formed by adding Ar and oxygen gases using a Ni target including a monovalent metal ion at a temperature in the range of about room temperature to about 200° C. An oxygen partial pressure may be in the range of about 5% to about 50%. When the oxygen partial pressure is greater than about 50%, threshold switching characteristics may not be obtained.

Any electrode material that is commonly used in a semiconductor device may be used as a material to form the first electrode 12 through the third electrode 22. For example, Al, Hf, Zr, Zn, W, Co, Au, Pt, Ru, Ir, Ti, Cu, an alloy thereof and/or a conductive metal oxide may be used, but example embodiments may not be limited thereto.

A binary oxide having at least two resistance characteristics according to electrical power application may be used to form the second resistor 18. For example, the second resistor 18 may be formed by including at least one selected from the group consisting of Ni oxide, Ti oxide, Hf oxide, Zr oxide, Zn oxide, Co oxide, Nb oxide, Hf oxide, W oxide, V oxide, Al oxide, Fe oxide, Cu oxide and Ta oxide, Cr oxide, TiNiO, LiNiO, AlO, InZnO, SrZrO and SrTiO. The binary oxide may further include at least one ion selected from the group consisting of a Ni ion, a Ti ion, a Hf ion, a Zr ion, a Zn ion, a W ion, a Co ion and a Nb ion to improve memory characteristics, and the amount of the binary oxide may be in the range of about 0.0001 wt % to about 5 wt %.

The second resistor 18 may be formed by adding inert and oxygen gases using sputtering, chemical vapor deposition, plasma vapor deposition and/or atomic layer deposition. The second resistor 18 formed of Ni oxide may be formed by adding Ar and oxygen gases by sputtering using a Ni target at a temperature in the range of about 300° C. to about 400° C. The oxygen partial pressure may be in the range of about 5% to about 15%.

The second resistor 18 formed of Ni oxide including a monovalent metal ion may be formed by adding Ar and oxygen gases by sputtering using a Ni target at a temperature in the range of about room temperature to about 200° C. The oxygen partial pressure may be in the range of about 5% to about 50%.

Figure 2A:
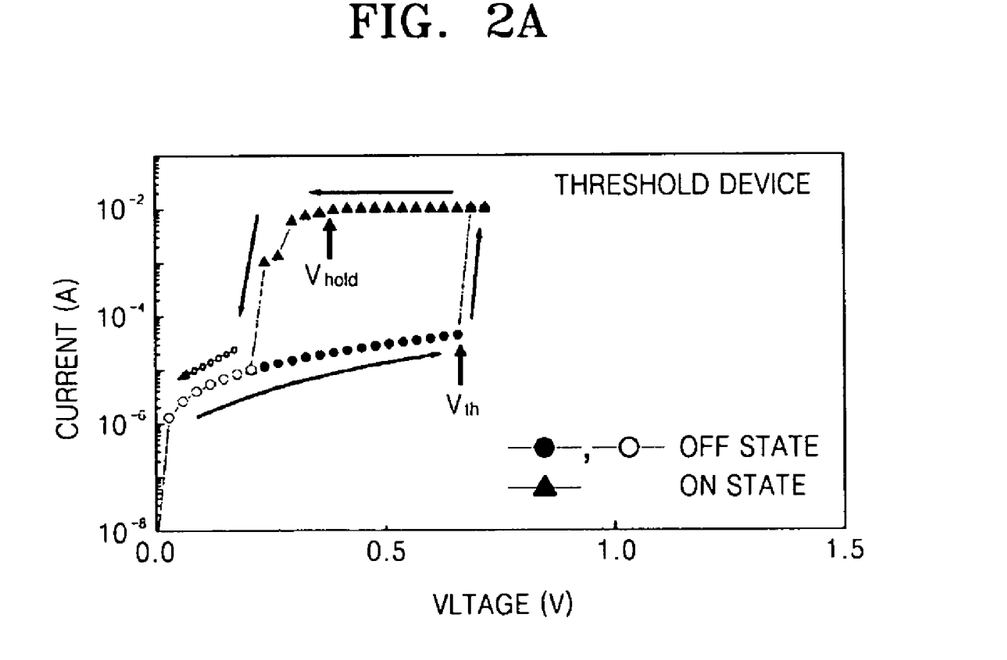
FIGS. 2A-2C shows a graph illustrating switching characteristics of a non-volatile memory device according to example embodiments.
Figure 2B:
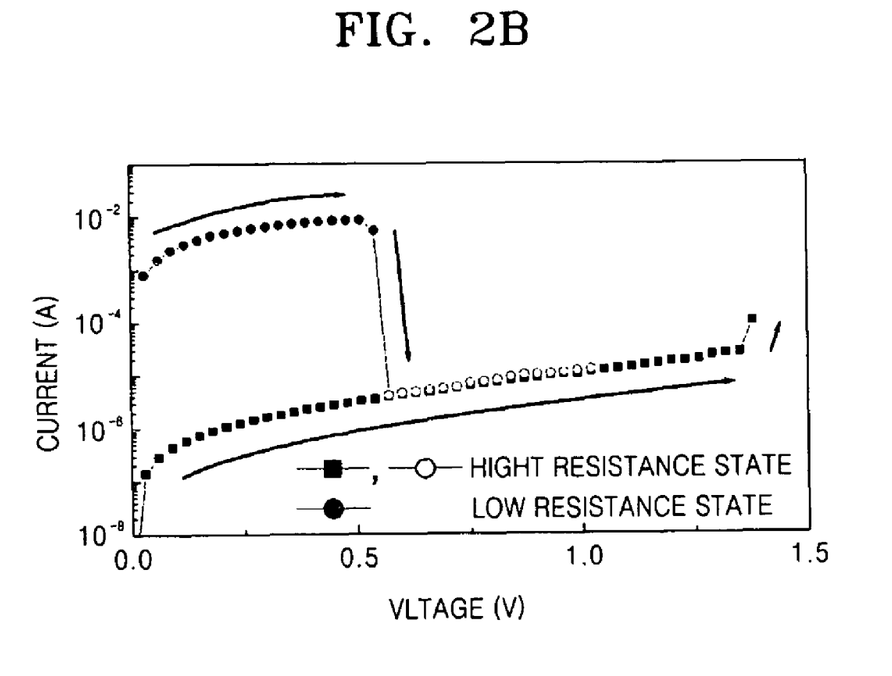
Figure 2C:
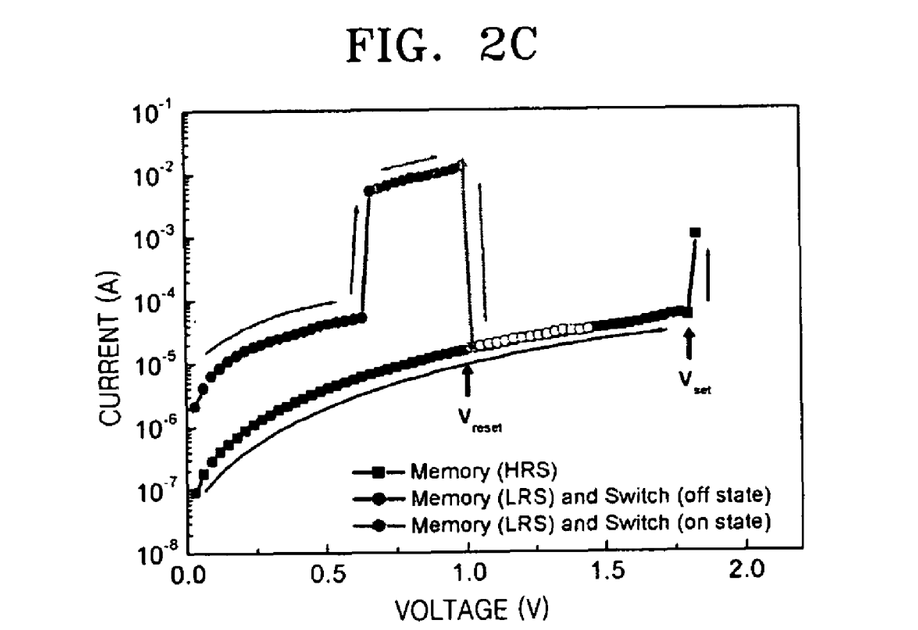

FIGS. 2A through 2C show a graph illustrating switching characteristics of a non-volatile memory device according to example embodiments. A first electrode layer was formed using Pt having a thickness of about 50 nm and a first resistor layer was formed on the first electrode layer to a size of about 10 um×about 10 um and a thickness of about 50 nm by sputtering using a Ni target including about 0.1 wt % of Li ion to form a non-volatile memory device. In the formation of the non-volatile memory device, the temperature was controlled at room temperature (at about 25° C.), Ar and oxygen gases were used as the gas for sputtering, and the oxygen partial pressure was about 30%.

An intermediate electrode was formed using Pt having a thickness of about 50 nm on the first resistor layer formed under the conditions described above, a second resistor layer was formed of Ni oxide, and a second electrode was formed using Pt having the same thickness. Referring to FIG. 2A, the first resistor layer shows a threshold switching characteristics and referring to FIG. 2B, the second resistor layer shows a memory switching characteristics. FIG. 2C shows a graph illustrating switching characteristics of a non-volatile memory device comprising the first resistor layer and the second resistor layer. Referring to FIG. 2C, the threshold switching device may function as a switch, and thus, the memory device may show resistance variation characteristics.

Figure 3:
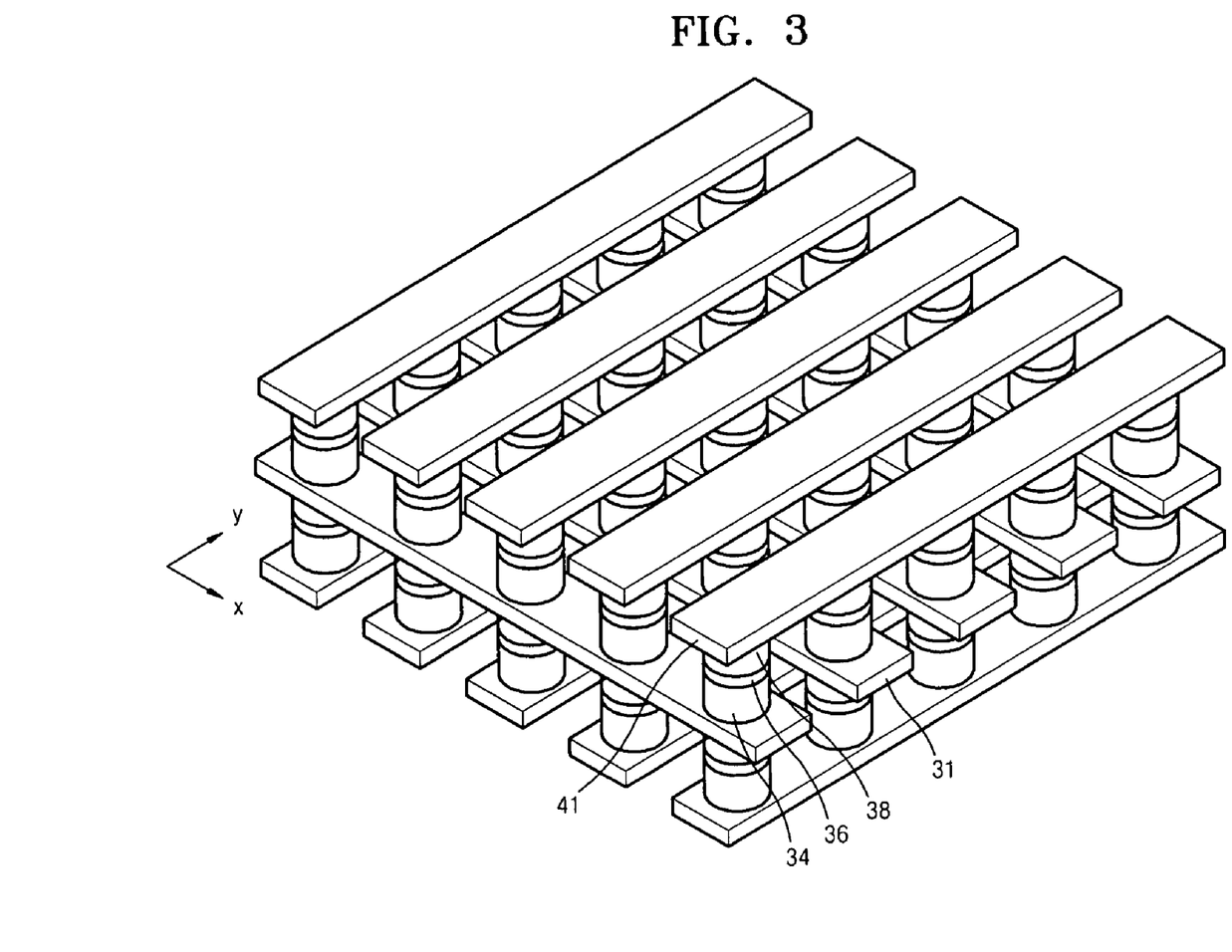
FIG. 3 shows a perspective view of a non-volatile memory device array according to example embodiments.

FIG. 3 shows a perspective view of a non-volatile memory device array according to example embodiments. Referring to FIG. 3, x direction conductive array lines 31 are crossing y direction conductive array lines 41. A first resistor 34, an intermediate electrode 36, and a second resistor 38 may be formed at intersections between the two conductive array lines, and thus, a cross point memory array may be prepared. The non-volatile memory device array may be formed in a multiple memory array structure.

FIGS. 4A-4F show processes of manufacturing a non-volatile memory device array according to example embodiments. Referring FIGS. 4A and 4B, a plurality of y direction conductive array lines 52 may be formed on a substrate 50 by patterning, and empty space between the conductive lines may be filled with an insulating layer 54.

Figure 4A:
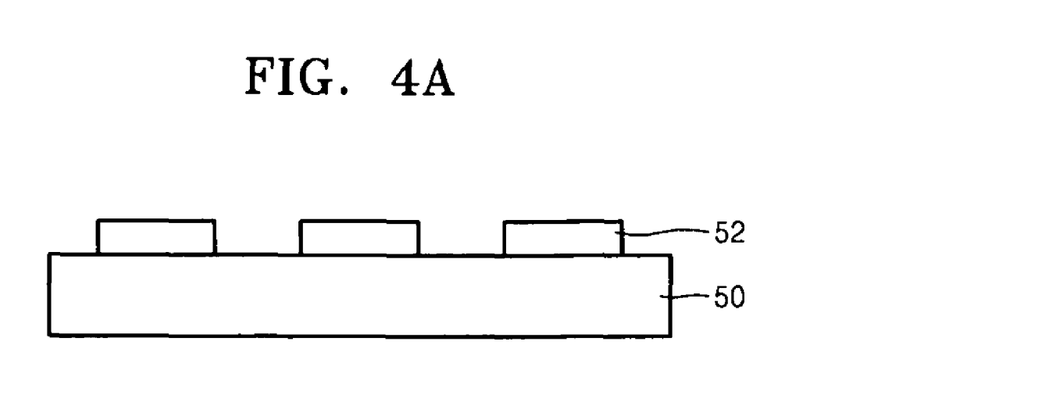
FIGS. 4A-4F show processes of manufacturing a non-volatile memory device array according to example embodiments.
Figure 4B:
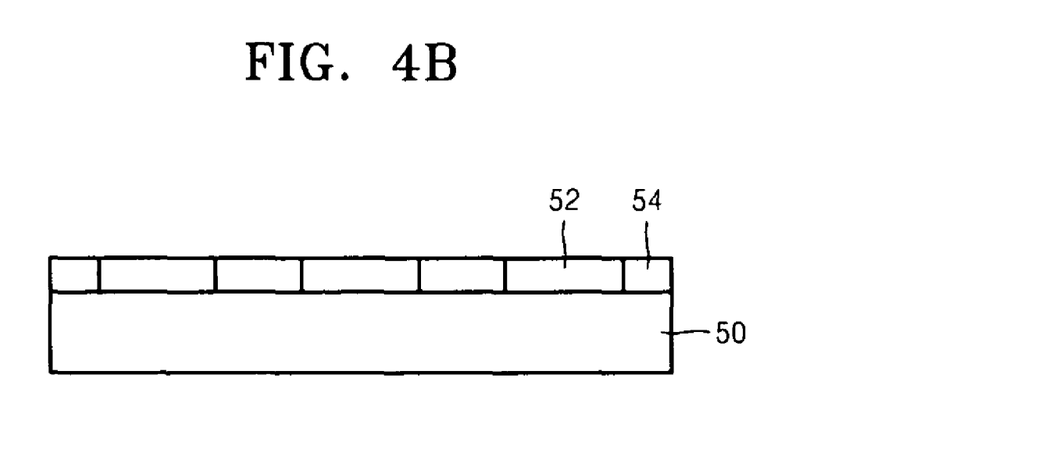
Figure 4C:
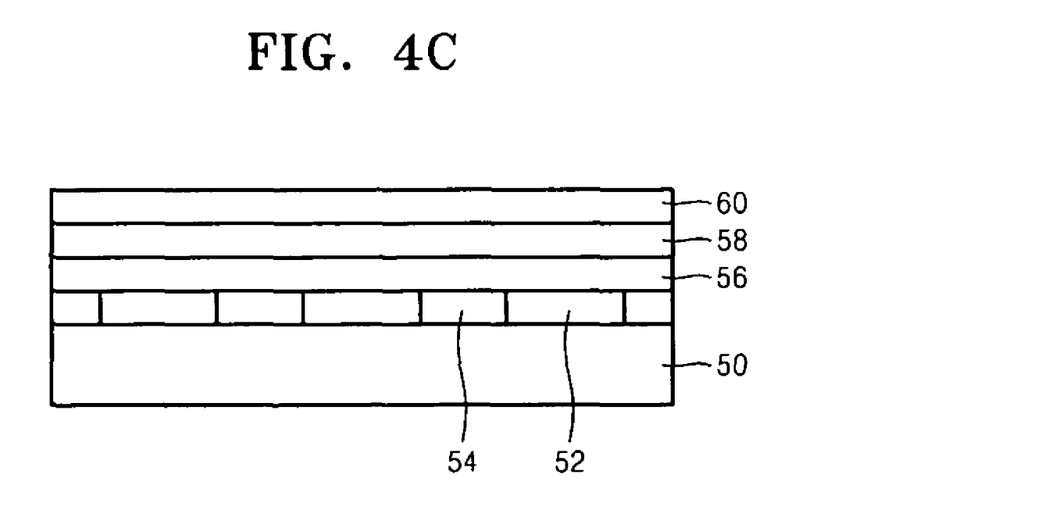
Figure 4D:
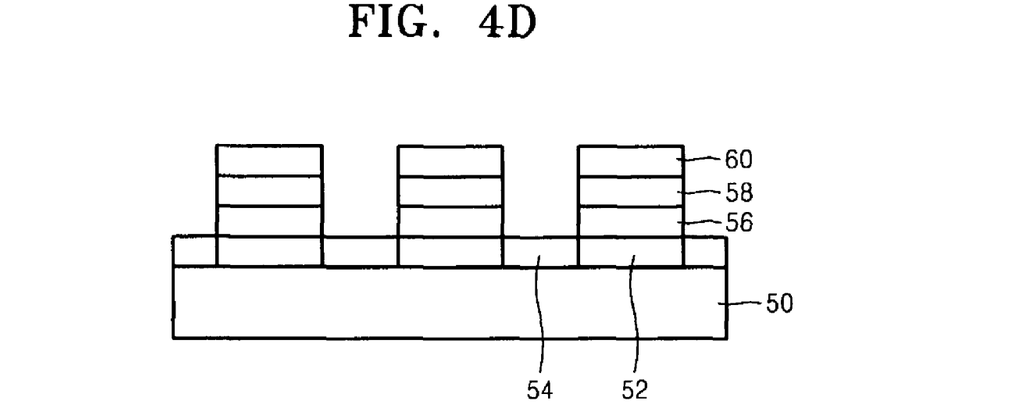
Figure 4E:
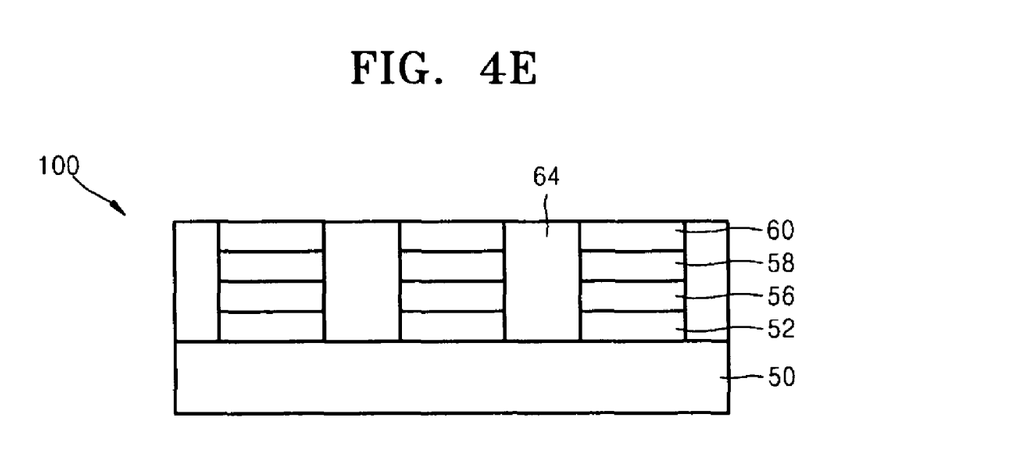

Referring to FIGS. 4C-4E, a first resistor layer 56, an intermediate electrode 58, and a second resistor layer 60 may be sequentially disposed on the conductive array lines 52 filled with the insulating layer 54, and may be patterned to form a unit cell and thereby form a memory array 100. The size of the unit cell may be smaller than or equal to that of the y direction conductive array lines 52. When the size of the unit cell is equal to that of the conductive array lines 52, a material for the conductive array lines 52 and a material for the unit cell may be laminated and simultaneously patterned. Space between the unit cells may be filled with an insulating layer 54, e.g., $SiO_2$, to be planarized. The positions of the first resistor layer 56 and the second resistor layer 60 may be exchanged.

Figure 4F:
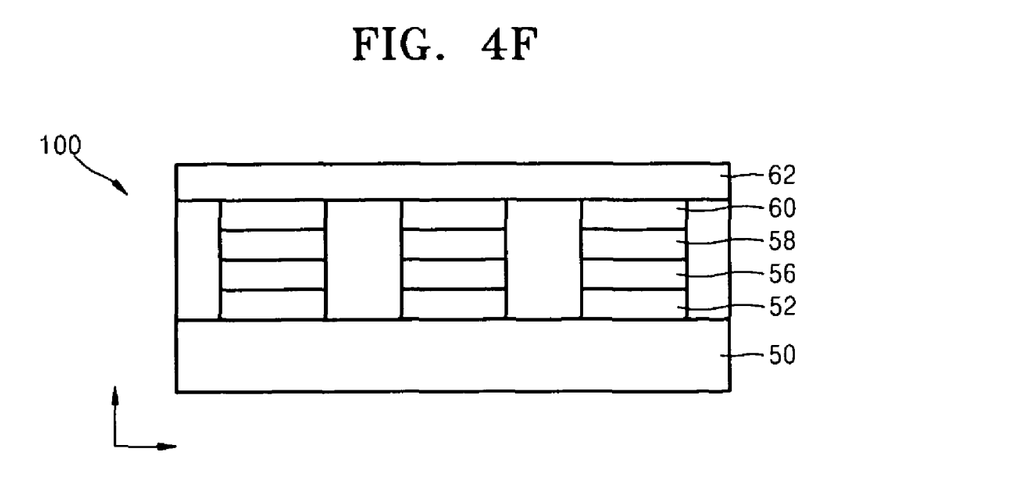

Referring to FIG. 4F, x direction conductive array lines 62 may be formed on each of the unit cells of the memory array 100 to form intersections with the y direction conductive array lines 52. A first resistor (not shown), an intermediate electrode (not shown), and a second resistor (not shown) may be additionally formed on the x direction conductive array lines 62, and y direction conductive array lines (not shown) may also be formed to cross the x direction conductive array lines 62. This process may be repeated in order to prepare an increased density memory. Consequently, the memory device according to example embodiments may be a cross point memory array including a plurality of unit cells formed between conductive array lines 52 and 62.

According to example embodiments, a non-volatile memory device having a structure may be prepared using a threshold switching resistor layer as a switching device and a cross point memory array including the simpler switching device may be prepared using a method of manufacturing the non-volatile memory device.

While example embodiments have been particularly shown and described with reference to example embodiments thereof, it will be understood by those of ordinary skill in the art that various changes in form and details may be made therein without departing from the spirit and scope of the following claims.

What is claimed is:

1. A non-volatile memory device comprising:
    a first resistor having threshold switching characteristics;
    an intermediate electrode on the first resistor; and
    a second resistor having at least two resistance characteristics on the intermediate electrode.

2. The non-volatile memory device of claim 1, further comprising:
    a first electrode, wherein the first resistor is formed on the first electrode; and
    a second electrode, wherein the second electrode is formed on the second resistor.

3. The non-volatile memory device of claim 1, wherein the first resistor is formed of Ni oxide, V oxide or GST.

4. The non-volatile memory device of claim 1, wherein the first resistor is formed of Ni oxide including a monovalent metal ion selected from the group consisting of an Li ion, a Na ion, a K ion, an Rb ion and a Cs ion.

5. The non-volatile memory device of claim 4, wherein the monovalent metal ion is an Li ion.

6. The non-volatile memory device of claim 4, wherein the amount of the monovalent metal ion in the first resistor is in a range of about 0.001 wt % to about 10 wt %.

7. The non-volatile memory device of claim 1, wherein the second resistor is formed of at least one material selected from the group consisting of Ni oxide, Ti oxide, Hf oxide, Zr oxide, Zn oxide, Co oxide, Nb oxide, Hf oxide, W oxide, V oxide, Al oxide, Fe oxide, Cu oxide and Ta oxide, Cr oxide, TiNiO, LiNiO, AlO, InZnO, SrZrO and SrTiO.

8. The non-volatile memory device of claim 7, wherein the second resistor further comprises a metal ion selected from the group consisting of a Ni ion, a Ti ion, a Hf ion, a Zr ion, a Zn ion, a W ion, a Co ion and a Nb ion.

9. The non-volatile memory device of claim 8, wherein the second resistor is formed of Ni oxide including a Ti ion.

10. A non-volatile memory device array comprising:
    at least two first conductive lines aligned in parallel and spaced a distance apart;
    at least two second conductive lines in a direction crossing the first conductive lines; and
    a laminate structure including the nonvolatile memory device according to claim 1, which is formed at intersections between the first conductive lines and the second conductive lines to form a memory cell.

11. A non-volatile memory device array of claim 10, wherein the memory array is a multiple memory array structure.

12. A method of manufacturing a non-volatile memory device array, the method comprising:
    forming at least two first conductive lines aligned in parallel and spaced a distance apart;
    forming a first resistor layer, an intermediate electrode layer and a second resistor layer on the first conductive lines;
    forming a laminate structure including the nonvolatile memory device manufactured according to claim 11 by patterning the first resistor layer, the intermediate electrode layer and the second resistor layer; and
    forming at least two second conductive lines in a direction crossing the first conductive lines on the laminate structure.

13. The method of claim 12, wherein the first resistor layer is formed of Ni oxide, V oxide or GST.

14. The method of claim 12, wherein the first resistor is formed of Ni oxide comprising a monovalent metal ion selected from the group consisting of an Li ion, a Na ion, a K ion, an Rb ion and a Cs ion.

15. The method of claim 12, wherein the first resistor layer is formed using sputtering, chemical vapor deposition, plasma vapor deposition, or atomic layer deposition.

16. The method of claim 13, wherein the first resistor layer is formed by sputtering at a temperature in the range of about 300° C. to about 400° C. in an oxygen partial pressure in the range of about 30% to about 50%.

17. The method of claim 14, wherein the first resistor layer is formed by sputtering at a temperature in the range of about room temperature to about 200° C. in an oxygen partial pressure in the range of about 5% to about 50%.

18. The method of claim 12, wherein the second resistor layer is formed of at least one material selected from the group consisting of Ni oxide, Ti oxide, Hf oxide, Zr oxide, Zn oxide, Co oxide, Nb oxide, Hf oxide, W oxide, V oxide, Al oxide, Fe oxide, Cu oxide and Ta oxide, Cr oxide, TiNiO, LiNiO, AlO, InZnO, SrZrO and SrTiO.

19. The method of claim 18, wherein the second resistor layer is formed of Ni oxide including a Ti ion.

20. The method of claim 19, wherein the second resistor layer is formed by sputtering at a temperature in the range of room temperature to about 200° C. in an oxygen partial pressure in the range of about 5% to about 50%.

21. A method of manufacturing a non-volatile memory device comprising:
    forming a first resistor having threshold switching characteristics on a first electrode;
    forming an intermediate electrode on the first resistor; and
    forming a second resistor having at least two resistance characteristics on the intermediate electrode.

22. The method of claim 21, further comprising:
    forming a second electrode on the second resistor.

23. The method of claim 21, wherein the first resistor is formed of Ni oxide, V oxide or GST.

24. The method of claim 21, wherein the first resistor is formed of Ni oxide comprising a monovalent metal ion selected from the group consisting of an Li ion, a Na ion, a K ion, an Rb ion and a Cs ion.

25. The method of claim 24, wherein the monovalent metal ion is an Li ion.

26. The method of claim 24, wherein the amount of the monovalent metal ion in the first resistor is in the range of 0.001 to 10 wt %.

27. The method of claim 21, wherein the second resistor is formed of at least one material selected from the group consisting of Ni oxide, Ti oxide, Hf oxide, Zr oxide, Zn oxide, Co oxide, Nb oxide, Hf oxide, W oxide, V oxide, Al oxide, Fe oxide, Cu oxide and Ta oxide, Cr oxide, TiNiO, LiNiO, AlO, InZnO, SrZrO and SrTiO.

28. The method of claim 27, wherein forming the second resistor further comprises forming a metal ion selected from the group consisting of a Ni ion, a Ti ion, a Hf ion, a Zr ion, a Zn ion, a W ion, a Co ion and a Nb ion.

29. The method of claim 25, wherein the second resistor is formed of Ni oxide comprising a Ti ion.

* * * * *